United States Patent

Nath et al.

[11] Patent Number: 5,090,356
[45] Date of Patent: Feb. 25, 1992

[54] CHEMICALLY ACTIVE ISOLATION PASSAGEWAY FOR DEPOSITION CHAMBERS

[75] Inventors: Prem Nath, Rochester Hills; Jon Call, Royal Oak; Gary M. Didio, Highland; Kevin Hoffman, Sterling Heights, all of Mich.

[73] Assignee: United Solar Systems Corporation, Troy, Mich.

[21] Appl. No.: 723,042

[22] Filed: Jun. 28, 1991

[51] Int. Cl.[5] .............................................. C23C 16/48
[52] U.S. Cl. ................................. 118/718; 118/719; 118/723; 414/217
[58] Field of Search ................ 118/718, 719, 723; 414/217

[56] References Cited

U.S. PATENT DOCUMENTS

| | | | |
|---|---|---|---|
| 4,626,447 | 12/1986 | Doehler | 118/718 |
| 4,664,951 | 5/1987 | Doehler | 118/718 |
| 4,723,507 | 2/1988 | Ovshinsky | 118/718 |
| 4,920,917 | 5/1990 | Nakatani | 118/718 |

Primary Examiner—Richard Bueker
Attorney, Agent, or Firm—Krass & Young

[57] ABSTRACT

An improved gas gate (34) is adapted to operatively interconnect to adjacent chambers in which process gases are introduced for depositing a first layer (16) upon a substrate (11) in a first chamber (28) and different process gases are introduced for depositing a second layer (18) in the second chamber (30) in continuous low pressure glow dicharge deposition process. A plurality of electrodes (60) and grounded shields (62) are positioned in the isolation passageway (92) of gas gate (34). The electrodes (60) have a potential sufficient to create a plasma from any gas molecule escaping from one of the deposition chambers. After the plasma is formed it is attracted to and captured or plated on the shield (62) preventing the gas plasma from landing on the substrate material (11) or passing through the gas gate. The present invention reduces the back diffusion of gases through the gas gate by actively eliminating free gas molecules by ionizing them to form a plasma and capturing the plasma ions in a permanent fashion.

16 Claims, 2 Drawing Sheets

CHEMICALLY ACTIVE ISOLATION PASSAGEWAY FOR DEPOSITION CHAMBERS

FIELD OF THE INVENTION

This invention generally relates to an apparatus which operatively interconnects deposition chambers adapted to produce photovoltaic devices and more particularly to an improved isolation passageway having a device therein to substantially eliminate contaminating gases from diffusing from one deposition chamber into an adjacent deposition chamber.

BACKGROUND OF THE INVENTION

The increasing scarcity and the realization of ecological and safety problems associated with non-renewable energy reserves, such as coal, petroleum and uranium, have made it apparent that it is essential that increased use be made of alternate non-depletable energy resources such as photovoltaic energy. Photovoltaic use has in the past been limited to special applications in part due to the high cost of manufacturing devices capable of producing photovoltaic energy. The development of a process that continuously deposits successive layers of amorphous semiconductor alloy material on an elongated substrate to fabricate photovoltaic devices in mass production has greatly promoted the use of photovoltaic energy.

Recently, considerable efforts have been expended to develop systems and processes for preparing thin film amorphous semiconductor alloy material which can be deposited so as to form p-type and n-type semiconductor alloy layers which can encompass relatively large areas for the production therefrom of thin film photovoltaic devices. It should be noted at this point that the term "amorphous" as used herein, is defined to include alloys or material exhibiting long range disorder, although said alloys or materials may exhibit short or intermediate range order or even contain crystalline inclusions.

In the economical continuous processing, a sheet of substrate material may be continuously advanced through a succession of operatively interconnected, environmentally protected deposition chambers, wherein each chamber is dedicated to the deposition of a specific layer of semiconductor alloy material onto the sheet or onto the previously deposited layer. For example, in making a solar cell of p-i-n type configuration, the first chamber is dedicated for depositing a p-type amorphous silicon semiconductor alloy, the second chamber is dedicated for the deposition of a layer of substantially intrinsic amorphous semiconductor alloy material and the third chamber is dedicated for depositing an n-type amorphous silicon semiconductor material. Since each deposited semiconductor alloy, and especially the intrinsic semiconductor alloy must be of high purity, the environment in the deposition chambers, particularly in the intrinsic deposition chamber, is isolated from the deposition constituents within the other chambers. The diffusion of the dopant constituents from the p-type and n-type alloy deposition chambers to the intrinsic deposition chamber is halted and the contamination of the intrinsic process gases in the intrinsic deposition chamber by dopant gases is prevented.

Gas gates have been used to isolate the adjacent deposition chambers. Some known gas gates contemplate the creation of a plurality of magnetic fields adapted to urge a magnetic sheet of substrate material against the wall of the gas gate passageway opening so that the height dimension of the passageway can be reduced. The reduced height of the opening correspondingly decreases the quantity of processed gas which back diffuses from the dopant deposition chambers to the intrinsic deposition chamber without correspondingly increasing the risk that the amorphous semiconductor layers deposited on the substrate contact and be damaged by a wall of the gas gate passageway opening.

Deposition processes which maintain gas pressures of approximately $5 \times 10^{-1}$ torr and above use gas gates through which a unidirectional flow of process gases from the intrinsic deposition chamber to the dopant deposition chamber is established with introduction of an inert gas which may be "swept" about the sheet of substrate material toward the dopant deposition chambers.

The sheet of substrate passing through the magnetic gas gates divides the passageway opening into a relatively wide lower slit and a relatively narrow upper slit. The velocity of the inert sweep gases and the residual process gases traveling through the wide lower slit is sufficiently great to substantially prevent the back diffusion of process gases from the dopant deposition chamber to the intrinsic chamber. However; due to the fact that the sweep gas and the deposition process gases are viscous, which viscosity becomes more pronounced at the elevated temperatures required for the glow discharge deposition of amorphous semiconductor layers onto the substrate, the drag on the sweep gases along the upper passageway wall and the unlayered surface of the substrate which define the relatively narrow upper slit results in a relatively low velocity flow therethrough. If left uncorrected, the low velocity flow is insufficient to prevent back diffusion therethrough.

Developments to correct the relatively low velocity in the narrow slit portion of the passageway introduce a plurality of grooves extending the length of the gas gate in the upper surface of the narrow slit through which high velocity inert gases sweep the dopants. The gas gate by being at least 8 inches long would create a virtually 100% probability that a process gas molecule from a deposition chamber enters one of the grooves during its back diffusion such that it is swept by the high velocity gases.

However, recent developments have made it desirable to operate deposition chambers at pressures lower than 1 millitorr. In this range of pressures, a gas gate using pressure differentials and inert gas flow, for sweeping dopant gas molecules needs a passageway opening of such narrow tolerances about the sheet of substrate that they are presently unachievable with today's best manufacturing tolerances. Furthermore, as pressures go down, the number of molecular collisions also decrease so that the length of the gas gate must be significantly lengthened to effectively stop back diffusion from one of the dopant chambers to the intrinsic deposition chamber. Significant lengthening of each gas gate between the plurality of deposition chambers would result in a significantly longer assembly line that is desirably to be avoided.

What is needed is a gas gate that can have a relatively short length and be effective in isolating dopant process gases in the dopant deposition chambers from back diffusing into the intrinsic deposition chamber for a wide range of deposition processing pressures including low pressures in the 1 millitorr range.

SUMMARY OF THE INVENTION

According to one aspect of the invention, a gas gate having an isolation passageway between two low pressure deposition chambers includes a plurality of electrodes for producing a plasma from any gaseous molecules in said isolation passageway. A plurality of grounded shields are constructed and positioned about the electrodes to be plated by the plasma and to prevent the produced plasma in the isolation passageway from depositing on the substrate.

Preferably the electrodes are elongated stainless steel, quarter inch diameter tubes that extend transversely across the passageway. The shields have a substantially U-shaped cross section and are elongated to coextend substantially with the electrodes. The electrode is positioned within a respective interior space defined by each U-shaped shield. The mid portion of the U-shaped shield is interposed between the electrode and the substrate with the side walls of the shield extending laterally beyond the electrode.

Preferably, the electrodes and shields are spaced both above and below the substrate. The electrodes and shields also extend transversely across the passageway and are spacedly positioned along the length of the passageway. In one embodiment, electrodes are connected to low frequency alternating current potential.

According to a broader aspect of the invention, an ionized plasma producing means converts the process gases that enter the isolation passageway into anionized plasma with an attraction means for electrically attracting the plasma and permanently grounding the plasma away from the substrate. One such plasma producing means is a microwave antenna directing electromagnetic energy in the form of microwave into a region of the isolation gate. In broader terms, an isolation passageway between two deposition chambers has an active chemical means for eliminating any deposition process gases that enters the isolation passageway.

In this fashion, a gas gate is constructed without the manufacturing constraints dictated by gas pressures and the introduction of sweep gases to prevent back diffusion. An isolation passageway has an active means for eliminating process gases that enter the isolation passageway from one of the two adjacent deposition chambers. In this way the gas gate can be substantially shortened compared to gas gates using sweep gases to prevent back diffusion. Furthermore, the gas gate according to the present invention is compatible with any standard sweep gas system that uses an inert gas for isolating deposition chambers in presently known continuous deposition processes for producing photovoltaic devices.

BRIEF DESCRIPTION OF THE DRAWINGS

Reference now is made to the accompanying drawings in which.

DETAILED DESCRIPTION OF THE PREFERRED EMBODIMENT

Figure 1:
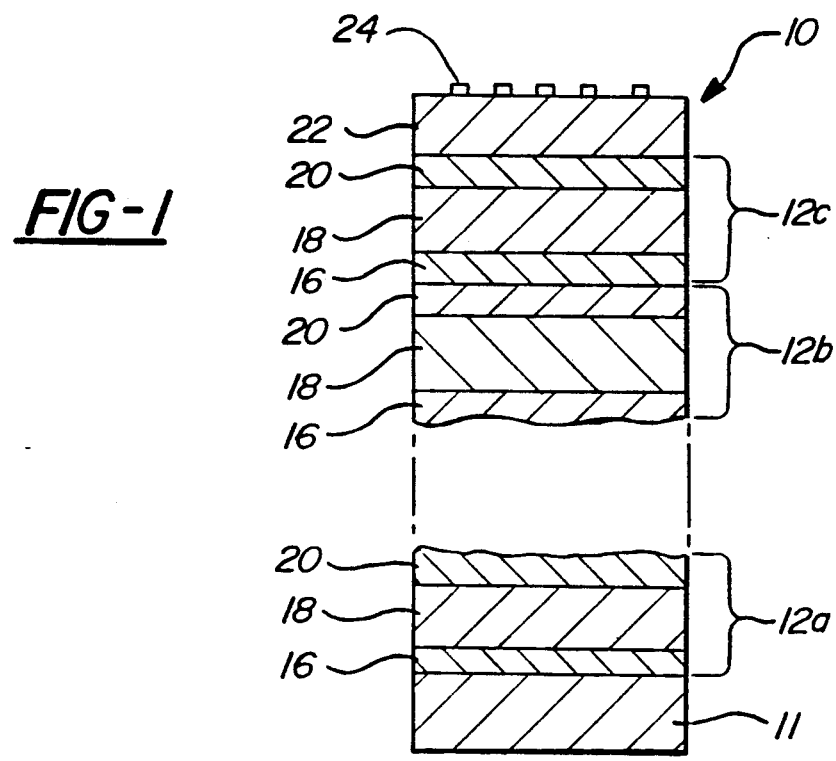
FIG. 1 is a fragmentary cross-sectional view of a tandem photovoltaic device including a plurality of p-i-n type cells, each layer of the cells formed from a thin film semiconductor alloy material.

Referring now to the drawings and particularly to FIG. 1, a photovoltaic cell 10 is shown formed from successive p-i-n layers, each of which is formed from a thin film semiconductor alloy material. The photovoltaic device such as a solar cell is made up of individual p-i-n type cells 12a, 12b and 12c. Below the lowermost cell 12a is a substrate 11 which may be transparent or formed from a metallic material such as stainless steel, aluminum, tantalum, molybdenum, chrome or metallic particles embedded within an insulator. For purposes of this application, the term "substrate" shall include not only the flexible film base but any elements added thereto by preliminary processing prior to the application of the amorphous semiconductor alloy layers.

Each of the cells 12a, 12b and 12c are preferably fabricated of an amorphous semiconductor material containing at least a silicon alloy, each of the cells including an p-type conductivity semiconductor layer 16, an intrinsic semiconductor layer 18 and a a-type semiconductor layer 20. Although p-i-n photovoltaic cells are illustrated, the improved gas gate according to the present invention is equally adapted for use in multiple chamber apparatus which is adapted to produce tandem n-i-p cells by simply reversing the order depositing the n-type and p-type layers onto the substrate. Additionally, the disclosed deposition apparatus may be readily adapted to produce p-n cells, Schottky barrier cells as well as other semiconductor devices such as diodes, memory arrays, photoconductive devices and the like.

It is to be understood that following the deposition of the semiconductor layers, a further deposition process may be either performed in a separate environment or as part of a continuous process. In further deposition processes, a "tco" (transparent conductive oxide) layer 22 preferably formed of indium tin oxide is added. An electrode grid 24 may be added to the device where the cell is of a sufficiently large area or if the conductivity of the tco layer 22 is insufficient. The grid 24 is adapted to shorten the carrier path and increase the conductive efficiency.

Figure 2:
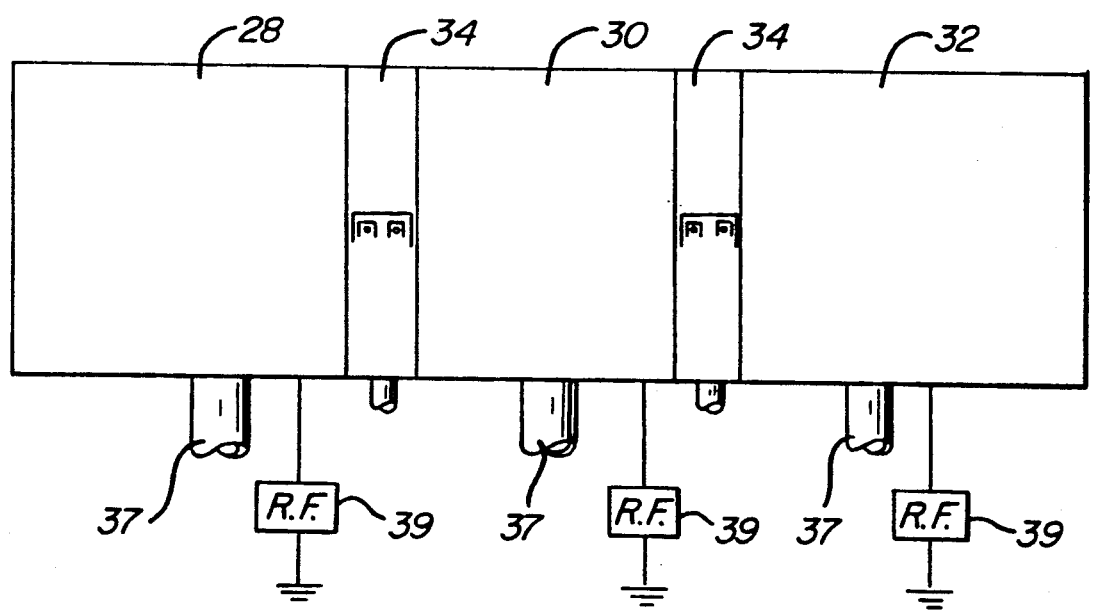
FIG. 2 is a schematic representation of a multiple chamber deposition system adapted to continuously deposit a plurality of successive thin film layers of semiconductor alloy material upon a continuously advancing substrate.

Referring now to FIG. 2, a generally schematic representation of a multi-chambered glow discharge deposition processor 26 is illustrated for the continuous production of tandem or cascade-type photovoltaic cells. The apparatus 26 includes a plurality of isolated dedicated deposition chambers 28, 30 and 32. The term "dedicated" as used herein means the precursor gaseous mixtures of each adjacent deposition chamber are substantially prevented from cross-contaminating one another. Moreover, each deposition chamber has introduced therein a particular precursor gaseous mixture of process gases for use therein. Each deposition chamber, 28, 30, and 32 is isolated from its neighbor by an isolation passageway 34 positioned between any two deposition chambers. The external isolation passageway 34 is commonly referred to as a gas gate.

It should be apparent that, although one triad of deposition chambers is illustrated and described, additional triads or additional individual chambers may be added to the apparatus to provide the machine capability of producing tandem photovoltaic cells having p-i-n type configuration as illustrated in FIG. 1, or n-i-p type, p-n type or n-p type configurations with a tco upper coating. However, for brevity of explanation, only two gas gates 34 are shown between three representative deposition chambers 28, 30 and 32. Each deposition chamber 28, 30 and 32 of the triad is adapted to deposit a single amorphous silicon semiconductor alloy by glow discharge deposition onto substrate 11.

Each of the deposition chambers 28, 30 and 32 has a standard construction known in the art. Reference is made to U.S. Pat. No. 4,450,786 issued to Doehler et al on May 29, 1989 or U.S. Pat. No. 4,723,509 issued to Ovshinsky et al. on Feb. 9, 1988 for a general dimension of deposition chambers. Generally a supply conduit 37 delivers process gas mixtures to the plasma regions created in each deposition chamber 28, 30 and 32. The plasma is energized by a radio frequency generator 39. Although not shown, it should be apparent that exhaust conduits are also associated with each deposition chamber for withdrawing non-used gases and non-deposited plasma.

To form the photovoltaic cell 10 illustrated in FIG. 1, a p-type amorphous silicon alloy layer 16 is deposited onto the substrate 11 in deposition chamber 28, an intrinsic amorphous silicon alloy layer 18 is deposited on the p-type layer 16 in the deposition chamber 30 and an n-type amorphous silicon alloy layer 20 is deposited atop the intrinsic layer 18 in deposition chamber 32. As a result, the apparatus 26 deposits at least three amorphous silicon alloy layers onto the substrate wherein the intrinsic layer deposited in deposition chamber 30 differs in composition from the layers deposited in deposition chambers 28 and 32 by the absence of at least one element which will be referred to as the dopants or dopant process gases.

It is important that each of the alloy layers and particularly the intrinsic layer deposit onto a surface of the substrate 11 be of high purity in order to produce high efficiency photovoltaic devices 10. It is therefore necessary to substantially prevent the back diffusion of dopant process gases from either chambers 28 or 32 into the intrinsic deposition chamber 30.

Figure 3:
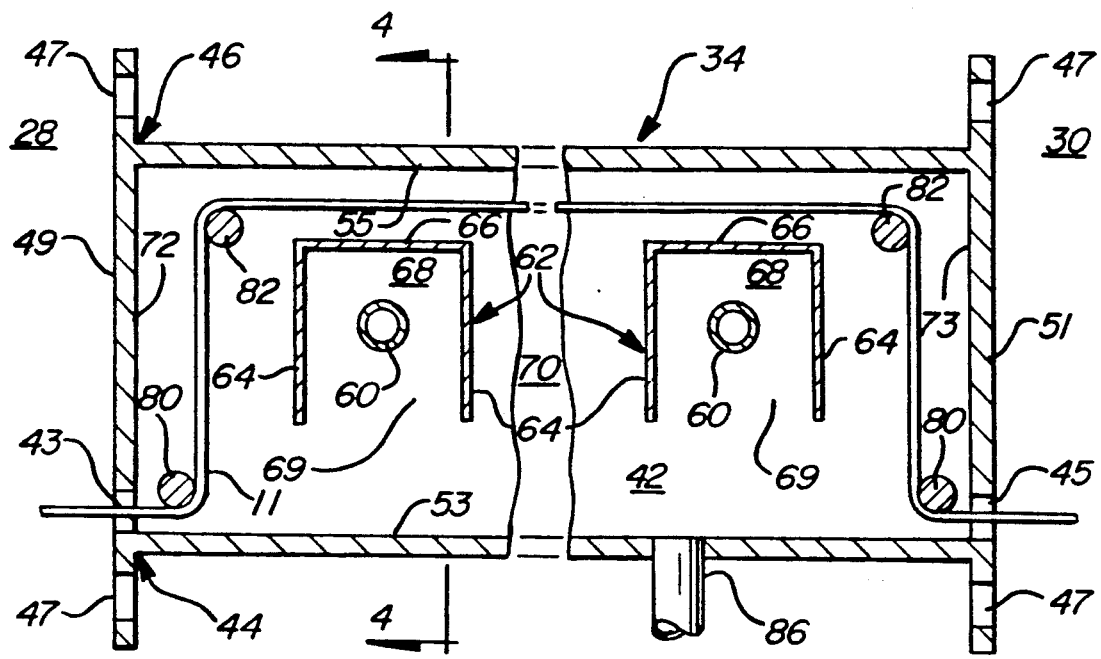
FIG. 3 is a side elevational segmented view illustrating an improved isolation passageway of the instant invention interposed between any two deposition chambers.

Referring now to FIG. 3, a gas gate apparatus 34 is interposed between deposition chamber 28 and deposition chamber 30 and between deposition chamber 30 and deposition chamber 32. Each gas gate 34 is identical and hence reference will only be made to the first gas gate between chambers 28 and 30. The gas gate 34 generally comprises a lower block 44 and an upper block 46 with an isolation passageway 42 formed therebetween. Both the lower block and the upper block include a plurality of apertures 47 in end panels 49 and 51, respectively, for mounting the gas gate 34 to the bulkhead between adjacent deposition chambers. The top surface of the lower block 44 forms lower wall 53 of isolation passageway 42 formed between the two deposition chambers. The lower surface of the upper block 46 forms the upper wall 55 of isolation passageway 42.

In general, the isolation passageway 42 is a relatively elongated narrow passageway that is sized to slidably receive substrate material 11 for passing therethrough from deposition chamber 28 to deposition chamber 30. The opposed side walls 57 are therefore spaced greater than the width of substrate material 11. The passageway 42 has an entrance 43 and exit 45 for allowing the substrate material 11 to enter from chamber 28 and exit to chamber 30. The entrance 43 and exit 45 can have a height between 1/16" and ½" and a width of 11 ½".

Guide rollers 80 and 82 direct substrates vertically upward toward wall 55, across the gas gate from wall 72 to wall 73 and down along wall 73 toward exit 45.

Figure 4:
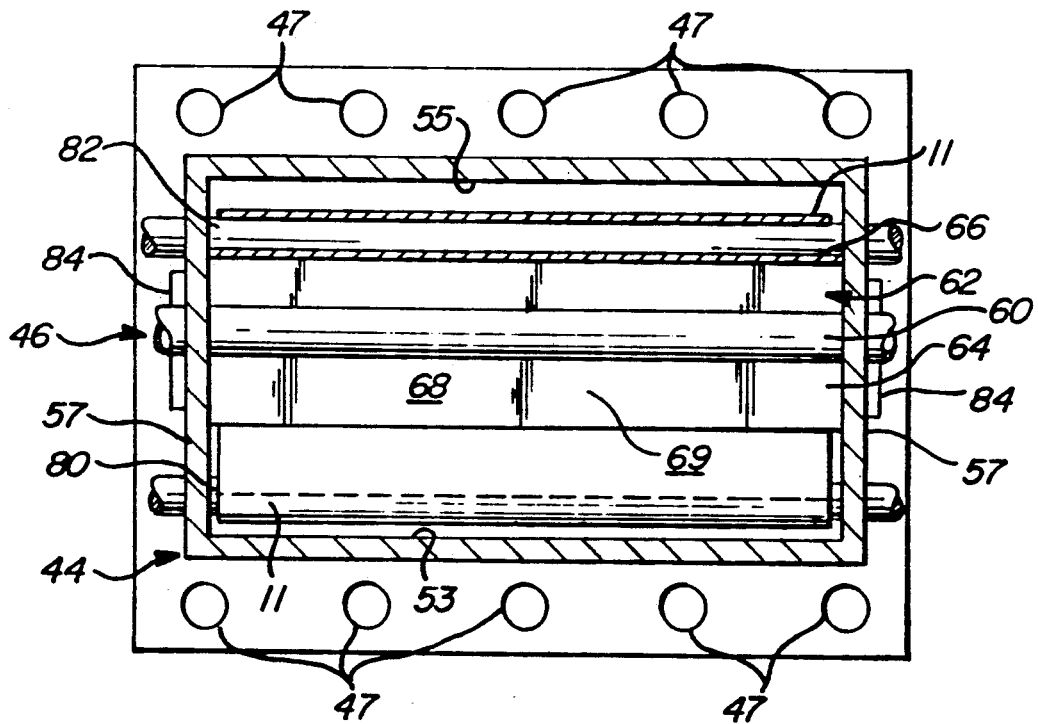
FIG. 4 is a cross-sectional view taken along lines 4—4 shown in FIG. 3.

The height of passageway 42 is great enough to mount a plurality of electrodes 60 and grounded shields 62 therein vertically positioned above entrance 43 and exit 45. As shown in FIG. 4, each electrode 60 extends substantially the whole width of passageway 42. As shown in FIG. 3, two electrodes 60 are spaced along the length of the passageway 42. Each electrode is made from a ¼" diameter stainless steel tube. The grounded shields 62 are made from stainless steel sheets bent in a substantially invented U-shape in cross section with two side walls 64 and a spanning portion or spanning middle wall 66. Each wall 64 and 66 are approximately 1" in width. The side wall 64 and middle portion 66 form an interior space 68 defined within the concavity formed by the U-shaped shield with an opening 69. The electrodes 60 are positioned within the interior space 68. Two shields 62 are spacedly positioned along the length of the passageway 42 such that there is a gap 70 defined between two adjacent side walls 64. The gap can be in approximately 6" long. The inner end walls 72 and 73 of upper block 46 are spaced from the nearest shield wall 64 by a gap of approximately ¼". The spanning wall 66 is positioned to be interposed between the electrodes 60 and the substrate 11. Each spanning wall 66 is spaced approximately from the substrate 11 between ¼" and 1". The substrate 11 is interposed between walls 66 and wall 55. The opening 69 to the interior space 68 is opposite the spanning wall 66 and faces away from the wall 55 and the portion of the substrate 11 adjacent wall 55. The opening 69 is spaced from lower wall 53 by approximately a one inch gap.

The electrodes are preferably connected to a low frequency alternating current such for example 75 Khz at 200 peak voltage. This electric field formed between the grounded shield 62 and the electrodes 60 are strong enough to ionize or molecularly fragment the process gaseous molecules that escape the deposition chambers through either entrance 43 or exit 45 into the isolation passageway 42 to form a plasma with the interior space 68. After the plasma is formed, it is deposited or plated onto the interior surfaces 65 and 67 of walls 64 and 66 of the grounded shield 62. The shields 62 contain the plasma and spatially isolates it from the remaining space of the gas gate. The shields 62 prevent the plasma from depositing onto the substrate 11 which is also grounded. Other frequencies and voltages can be used with the general parameters that the voltage must be less than would cause sparking between the electrode and grounded shield and the frequency should be low enough to prevent the plasma from being over energized which would prevent it from landing on the shield. One can foresee using up to 1,000 volts before sparking and other problems due to extremely high voltage occur.

The total length of the typical gate 34 can be under 12 inches long, with approximately two electrodes and shields spacedly positioned along the length of the passageway 42. The serpentine path of the substrate 11 particularly about rollers 80 provide for a line of sight of any gaseous particles entering either entrance 43 or exit 45 to the plasma cavity 68. The grounding of the plasma on shield 62 provides for a chemical pump that also provides for attraction of gaseous molecules in the gas gate.

In this geometric fashion, it is a virtual 100% probability that a gaseous molecule or processing gas from the deposition chambers 28 will migrate into one of the interior spaces 68 during its back diffusion migration from chamber 28 toward chamber 30. As such the chamber 30 is effectively isolated from chamber 28 and any possible contamination from chamber 28 is eliminated by the active destruction of free gaseous molecules escaping from chamber 28 by the electrodes and shields 62 within the isolation passageway 42.

In this fashion, a gas gate 34 with isolation passageway 42 can effectively isolate a series of deposition chambers from each other. The gas gate 34 is compatible to use sweep gases in addition if so desired. However the gas gate 34 by actively eliminating gaseous molecules is not solely dependent on molecular collisions to prevent back diffusion of gaseous molecules from the deposition chamber 28 toward the intrinsic deposition chamber 30. As such, the gas gate 34 can be relatively shorter than comparable flow gas gates used at extremely low pressures in the area of 1 millitorr in a continuous deposition process for forming photovoltaic cells.

The plasma generating region 68 may also be magnetically enhanced by permanent magnets 84 attached to the side walls 57. The magnets 84 provide curvature to the path of any plasma particle thereby increasing its path distance and probability of colliding with a gaseous particle causing an avalanche of plasma generating particles each also curving as it moves in the magnetic field.

An optional vacuum pump 86 can also be attached to the gas gate 34 to evacuate the gas gate 34 of gaseous particles. Furthermore, the gas gate can include the use of sweep gases as is known in the art.

It is also foreseen that the electrodes can be replaced with a microwave generating antenna that directs electromagnetic radiation into region 68 to provide a plasma generating mechanism.

Variations and modifications of the above-described invention are possible without departing from its spirit and scope as defined in the appended claims.

The embodiments in which an exclusive property and privilege is claimed are defined as follows:

1. In an isolation passageway adapted to operatively interconnect a first and second adjacent low pressure deposition chamber wherein a first semiconductor layer is deposited on a substrate in said first chamber and a second semiconductor layer is deposited on said substrate in said second chamber, to provide reduced diffusion of gases between said first and second chambers and to provide passage of said substrate therethrough; said improvement characterized by:
   a plurality of electrodes positioned in said passageway for producing a plasma from any gases in said isolation passageway;
   a plurality of grounded shields constructed and positioned to be plated by said plasma and preventing plasma within said isolation passageway from depositing on said substrate.

2. In an isolation passageway as defined in claim 1 further characterized by:
   said shields each having a substantially U-shaped cross section and elongated to co-extend substantially with said electrode; and
   said electrode being positioned within the interior space defined by said U-shaped shield.

3. In an isolation passageway as defined in claim 2 further characterized by:
   said electrodes and shields each extending transversely across said passageway;
   said electrodes and shields being spacedly positioned along the length of said passageway.

4. In an isolation passageway as defined in claim 2 further characterized by:
   said shields having a midportion interposed between said electrodes and said substrate.

5. In a isolation passageway as defined in claim 4 further characterized by:
   said shields having a downwardly facing opening;
   said substrate enters said passageway at a point below said opening of said shield and passes upwardly above and over said shield and downwardly to a point below said shield where it exits said passageway.

6. In a isolation passageway as defined in claim 1 further characterized by:
   said electrodes and shields each extending transversely across said passageway;
   said electrodes and shields being spacedly positioned along the length of said passageway.

7. In an isolation passageway as defined in claim 1 further characterized by:
   said shields interposed between said electrodes and said substrate.

8. In an isolation passageway as defined in claim 7 further characterized by:
   said shields having a downwardly facing opening;
   said substrate enters said passageway at a point below said opening of said shield and passes upwardly above and over said shield and downwardly to a point below said shield where it exits said passageway.

9. In an isolation passageway as defined in claim 1 further characterized by:
   said electrodes being connected to a low frequency alternating current potential.

10. In an isolation passageway as defined in claim 1 further characterized by:
    said shield each contoured substantially about a perimeter of said electrode and defining a cavity in which said electrode is positioned and said shield having an opening facing away from a portion of said substrate.

11. In an isolation passageway as defined in claim 10 further characterized by:
    said shields having a downwardly facing opening;
    said substrate enters said passageway at a point below said opening of said shield and passes upwardly above and over said shield and downwardly to a point below said shield where it exits said passageway.

12. In an isolation passageway adapted to operatively interconnect a first and second adjacent low pressure deposition chamber wherein a first semiconductor layer is deposited on a substrate in one of said first chamber and a second semiconductor layer is deposited on said substrate in said second chamber, to provide reduced diffusion of gases between said first and second chambers, and to provide passage of said substrate therethrough; said improvement characterized by:
    a plasma generating means for converting said process gases in said isolation passageway into a plasma; and an attraction means for electrically attracting said plasma and spatially isolating said plasma away from said substrate.

13. In an isolation passageway as defined in claim 12 further characterized by:

a plurality of plasma generating means spacedly positioned along the length of said passageway, each of said generating plasma means being elongated and extending transversely across said passageway.

14. In an isolation passageway as defined in claim 13 further characterized by:

said attraction means being interposed between said plasma generating means and said substrate.

15. In an isolation passageway as defined in claim 12 further characterized by:

a grounded shield for partially defining a space for said spatially isolated plasma and for grounding said plasma thereon.

16. In an isolation passageway adapted to operatively interconnect a first and second adjacent low pressure deposition chamber wherein a first semiconductor layer is deposited on a substrate in one of said first chamber and a second semiconductor layer is deposited on said substrate in said second chamber, to provide reduced diffusion of gases between said first and second chambers and to provide passage of said substrate therethrough; said improvement characterized by:

means for chemically attaching to said gases within said isolation passageway for eliminating free diffusing gaseous molecules, atoms, and ions within said isolation passageway.

* * * * *